(12) United States Patent
Kim et al.

(10) Patent No.: US 9,202,824 B2
(45) Date of Patent: Dec. 1, 2015

(54) DISPLAY PANEL INCLUDING ROOF LAYER HAVING REDUCED THICKNESS AT OPENING THEREOF, AND METHOD OF MANUFACTURING THE SAME

(71) Applicant: Samsung Display Co., LTD., Yongin, Gyeonggi-Do (KR)

(72) Inventors: Han-Su Kim, Seoul (KR); Ha-Young Park, Uijeongbu-si (KR); Seung-Yeon Chae, Hwaseong-si (KR); Sang-Gun Choi, Suwon-si (KR); Se-Hee Han, Seoul (KR); Tae-Woon Cha, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/333,721

(22) Filed: Jul. 17, 2014

(65) Prior Publication Data

US 2015/0236041 A1   Aug. 20, 2015

(30) Foreign Application Priority Data

Feb. 17, 2014   (KR) .......................... 10-2014-0017992

(51) Int. Cl.
| | |
|---|---|
| *H01L 23/31* | (2006.01) |
| *H01L 27/15* | (2006.01) |
| *H01L 29/786* | (2006.01) |
| *H01L 51/56* | (2006.01) |
| *H01L 51/52* | (2006.01) |
| *H01L 27/12* | (2006.01) |
| *H01L 33/54* | (2010.01) |
| *H01L 33/50* | (2010.01) |

(52) U.S. Cl.
CPC .......... *H01L 27/1248* (2013.01); *H01L 27/124* (2013.01); *H01L 27/1262* (2013.01); *H01L 27/1288* (2013.01); *H01L 33/50* (2013.01); *H01L 33/54* (2013.01); *H01L 2933/005* (2013.01); *H01L 2933/0016* (2013.01)

(58) Field of Classification Search
None
See application file for complete search history.

(56) References Cited

U.S. PATENT DOCUMENTS

| | | | | |
|---|---|---|---|---|
| 2013/0308071 A1* | 11/2013 | Kim et al. | ........................ | 349/43 |
| 2014/0125910 A1* | 5/2014 | Kim et al. | ........................ | 349/46 |
| 2014/0368770 A1* | 12/2014 | Chae et al. | ........................ | 349/96 |

FOREIGN PATENT DOCUMENTS

| | | |
|---|---|---|
| KR | 1020120026880 A | 3/2012 |
| KR | 1020130081243 A | 7/2013 |
| KR | 1020140145723 A | 12/2014 |

* cited by examiner

*Primary Examiner* — Joseph Schoenholtz
(74) *Attorney, Agent, or Firm* — Cantor Colburn LLP (57) ABSTRACT

A display panel includes a substrate, a gate line, a color filter and a roof layer. The substrate includes a thin film transistor disposed thereon. The gate line extends along a first direction on the substrate and is connected to the thin film transistor. The color filter is disposed on the substrate. The roof layer is disposed on the color filter and is configured to define a tunnel-shaped cavity between the roof layer and the color filter. The tunnel-shaped cavity extends along a second direction crossing the first direction. A cross-sectional thickness of an area of the roof layer adjacent to the gate lines is smaller than a cross-sectional thickness of another area of the roof layer spaced apart from the gate lines.

20 Claims, 9 Drawing Sheets

DISPLAY PANEL INCLUDING ROOF LAYER HAVING REDUCED THICKNESS AT OPENING THEREOF, AND METHOD OF MANUFACTURING THE SAME

This application claims priority to Korean Patent Application No. 10-2014-0017992, filed on Feb. 17, 2014, and all the benefits accruing therefrom under 35 U.S.C. §119, the disclosure of which is incorporated by reference herein in its entirety.

BACKGROUND (1) Field

Exemplary embodiments of the invention relate to a display panel and a method of manufacturing the same, and more particularly, to a display panel including one substrate with improved a margin in an inkjet printing process and a method of manufacturing the same.

(2) Description of the Related Art

A display panel includes an array substrate, a color filter substrate, and a liquid crystal layer disposed between the array substrate and the color filter substrate. The array substrate includes switching elements, the color filter substrate includes color filters disposed therein, and the color filter substrate faces the array substrate. The array substrate includes a first substrate and the color filter substrate includes a second substrate, thus resulting in a relatively high manufacturing cost since the display panel includes two substrates.

An embedded micro-cavity ("EM") display panel includes switching elements and color filters on one substrate, and the EM receives a liquid crystal molecule therein.

SUMMARY

In an embedded micro-cavity ("EM") display panel, the EM includes a tunnel-shaped cavity ("TSC") to receive a liquid crystal molecule therein. In an alignment layer process and a liquid crystal injecting process, an alignment liquid and a liquid crystal are injected into an inner space of the TSC via an opening, such as by an inkjet printing process. However, in general, a height of an area of the TSC where the opening is disposed, is greater than a height of an area of the TSC where the opening is not disposed. Therefore, an upper surface of the TSC is sloped due to the different heights, so that an injection of an alignment liquid and a liquid crystal may be difficult.

One or more exemplary embodiment provides a display panel capable of maintaining an aperture ratio and decreasing poor-performing pixels.

One or more exemplary embodiment also provides a method of manufacturing the above-mentioned display panel.

In accordance with an exemplary embodiment, a display panel includes a substrate, a gate line, a color filter and a roof layer. The substrate includes a thin film transistor thereon. The gate line extends along a first direction on the substrate and is connected to the thin film transistor. The color filter is on the substrate. The roof layer is on the color filter and configured to define a tunnel-shaped cavity between the roof layer and the color filter. The tunnel-shaped cavity extends along a second direction crossing the first direction. A cross-sectional thickness of an area of the roof layer adjacent to the gate line is smaller than a cross-sectional thickness of another area of the roof layer spaced apart from the gate line.

In an exemplary embodiment, a cross section of the roof layer along the second direction may be a semi-spherical shape.

In an exemplary embodiment, the display panel may further include a first electrode on an upper surface of the color filter and a second electrode on a lower surface of the roof layer.

In an exemplary embodiment, the display panel may further include a passivation layer covering the first electrode, and insulating the first electrode and the second electrode.

In an exemplary embodiment, the roof layer may cover the second electrode.

In an exemplary embodiment, the display panel may further include an image display layer in the tunnel-shaped cavity, and configured to display an image by an electric field applied thereto and formed between the first electrode and the second electrode.

In an exemplary embodiment, the display panel may further include a black matrix on the gate line and configured to block light.

In an exemplary embodiment, the display panel may further include a supporter on the black matrix and configured to support the roof layer.

In an exemplary embodiment, the display panel may further include a protection layer on the roof layer and encapsulating the tunnel-shaped cavity.

In accordance with an exemplary embodiment, a method of manufacturing of a display panel is provided. A color filter on a substrate including a thin film transistor thereon, and a gate line thereon and connected to the thin film transistor is formed. A sacrificial layer is formed on the color filter. A photoresist material is coated on the substrate to cover the sacrificial layer. A roof layer is formed by exposing the photoresist material to light. A cross-sectional thickness of an area of the roof layer adjacent to the gate lines is smaller than a cross-sectional thickness of another area of the roof layer spaced apart from the gate lines.

In an exemplary embodiment, in forming the roof layer, a slit mask may be provided on the substrate including the photoresist material. The slit mask may include a slit area configured to transmit light therethrough and a blocking area and configured to block light. The photoresist material on the substrate is exposed to light. The exposed photoresist material substrate may be developed.

In an exemplary embodiment, the photoresist material may be a positive type.

In an exemplary embodiment, the slit area may overlap the gate line.

In an exemplary embodiment, the photoresist material may be a negative type.

In an exemplary embodiment, the blocking area may overlap the gate line.

In an exemplary embodiment, the forming the roof layer further may include defining an opening at a side surface of the roof layer.

In an exemplary embodiment, after the color filter is formed, a first electrode may be formed on the color filter. A black matrix may be formed on the gate line. A passivation layer may be formed to cover the first electrode and the black matrix. A supporter may be formed on the black matrix to support the roof layer.

In an exemplary embodiment, after forming the sacrificial layer, a second electrode may be formed on the sacrificial layer.

In an exemplary embodiment, the sacrificial layer may be removed by a developer to define a tunnel-shaped cavity from which the sacrificial layer is removed. An alignment layer may be formed on surfaces defining the tunnel-shaped cavity from which the sacrificial layer is removed. An image display layer may be formed in the tunnel-shaped cavity.

In an exemplary embodiment, a protection layer surrounding the roof layer to encapsulate the tunnel-shaped cavity may be formed.

In one or more exemplary embodiment, a display panel and a method of manufacturing the same include a roof layer on a color filter. A height of the roof layer adjacent to gate line is formed to be relatively thin, so that a margin of an alignment liquid injection process and a liquid crystal injection process may be improved.

BRIEF DESCRIPTION OF THE DRAWINGS

The above and other features of the invention will become more apparent by describing in detailed exemplary embodiments thereof with reference to the accompanying drawings, in which:

FIGS. 4A to 12 are cross-sectional views illustrating an exemplary embodiment of a method of manufacturing a display panel, taken along line I-I' in FIG. 2, in accordance with the invention.

DETAILED DESCRIPTION

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in detail with reference to the accompanying drawings.

Figure 1:
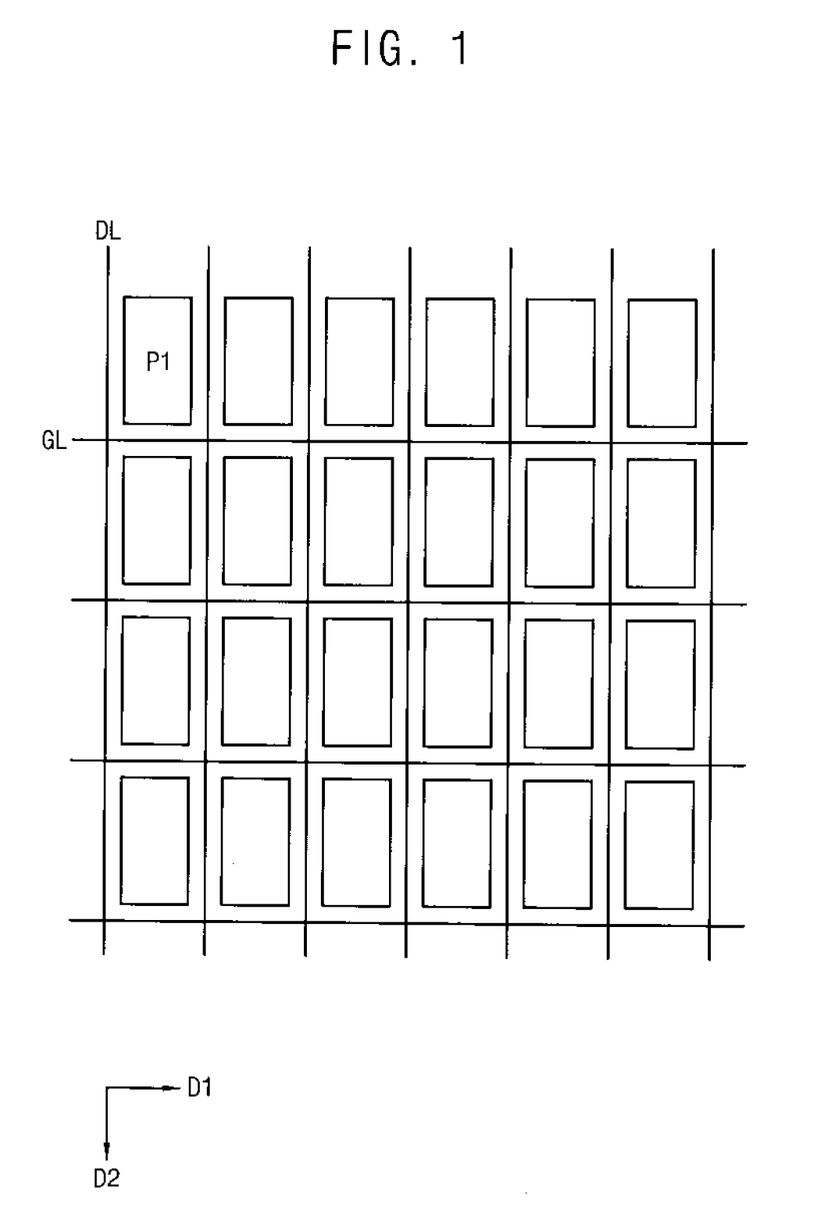
FIG. 1 is a plan view illustrating an exemplary embodiment of a display panel in accordance with the invention.

FIG. 1 is a plan view illustrating an exemplary embodiment of a display panel in accordance with the invention.

Referring to FIG. 1, a display panel includes a plurality of gate lines GL, a plurality of data lines DL and a plurality of pixels.

The gate lines GL may extend in a first direction D1. The data lines DL may extend in a second direction substantially crossing the first direction D1. Alternatively, the gate lines GL may extend in the second direction D2 and the data lines DL may extend in the first direction D1.

The pixels may be arranged in a matrix shape. In one exemplary embodiment, the pixels may be disposed in areas defined by the gate lines GL and the data lines DL, but the invention is not limited thereto.

Each pixel may be connected to a corresponding gate line GL and a corresponding data line DL, adjacent to the pixel.

Each pixel may have a rectangle planar shape elongated in the second direction D2. Alternatively, the pixel may have a V-shape, a Z-shape, etc. in the plan view.

A structure of a pixel will be described in detail with reference to FIGS. 2 and 3.

Figure 2:
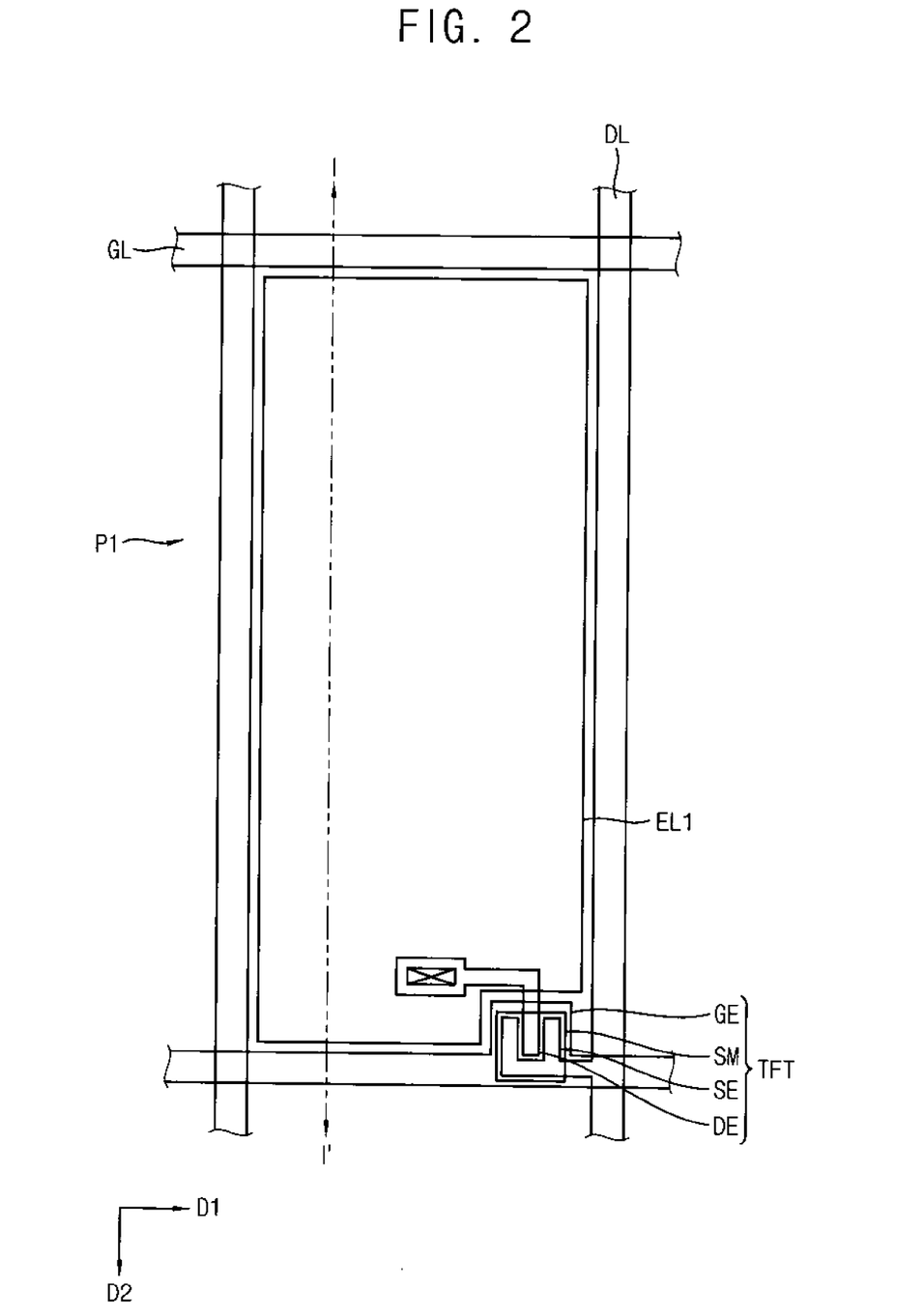
FIG. 2 is a plan view illustrating an exemplary embodiment of a pixel in the display panel in FIG. 1.
Figure 3:
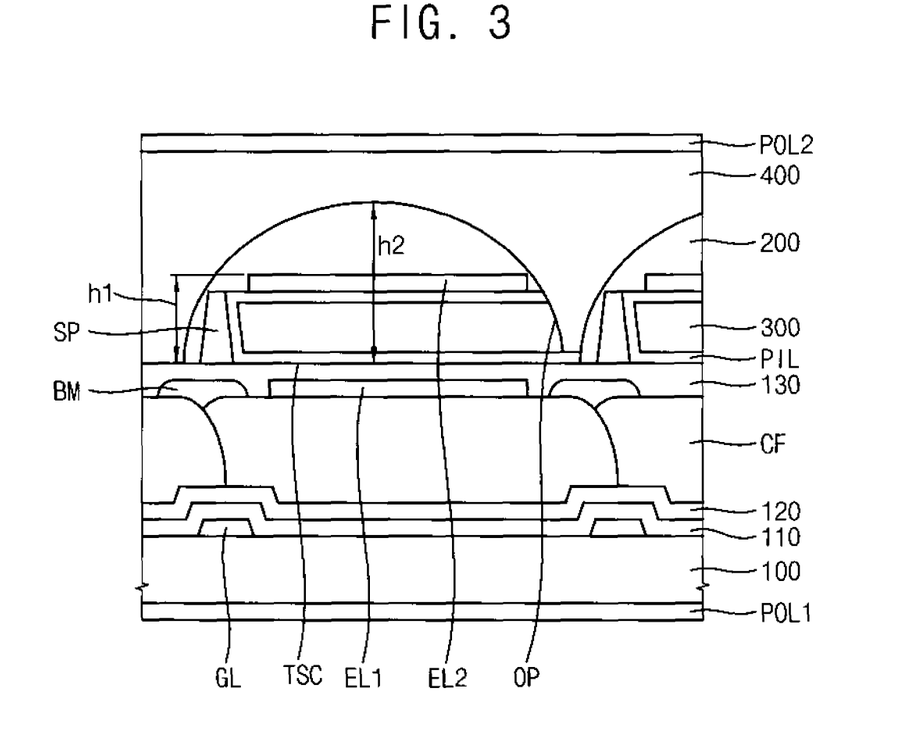
FIG. 3 is a cross-sectional view taken along line I-I' in FIG. 2.

FIG. 2 is a plan view illustrating an exemplary embodiment of a pixel P1 in the display panel in FIG. 1. FIG. 3 is a cross-sectional view taken along line I-I' in FIG. 2;

Referring to FIGS. 1 to 3, the display panel includes a substrate 100, a plurality of thin film transistors TFT, a gate insulation layer 110, a data insulation layer 120, a color filter CF, a black matrix BM, a first electrode EL1 a passivation layer 130, a supporter SP, an alignment layer PIL, a roof layer 200, an image displaying layer 300, a second electrode EL2 and a protection layer 400. The display panel may include only one substrate upon which elements and layers thereof are disposed.

The substrate 100 may be a transparent insulation substrate. Examples of the transparent insulation substrate include, but are not limited to, a glass substrate, a plastic substrate, etc. The substrate 100 may include a plurality of pixel areas for displaying an image. The plurality of the pixel areas may be disposed in a matrix shape having a plurality of rows and a plurality of columns.

Each pixel may further include a switching element. In one exemplary embodiment, for example, the switching element may be a thin film transistor TFT. The switching element may be connected to a corresponding gate line GL and a corresponding data line DL adjacent to the switching element. The switching element may be disposed at a crossing area of the gate line GL and the data line DL, but the invention is not limited thereto.

A gate pattern may include a gate electrode GE and the gate line GL. The gate pattern may be disposed on the substrate 100. The gate line GL is electrically connected to the gate electrode GE.

The gate insulation layer 110 may be disposed on the substrate 100 to cover the gate pattern and may insulate the gate pattern from other elements or layers of the display panel.

A semiconductor pattern SM may be disposed on the gate insulation layer 110. The semiconductor pattern SM may overlap the gate electrode GE.

A data pattern may include the data line DL, a source electrode SE and a drain electrode DE. The data pattern may be disposed on the semiconductor pattern SM, which is disposed on the gate insulation layer 110. The source electrode SE may overlap the semiconductor pattern SM. The source electrode SE may be electrically connected to the data line DL.

The drain electrode DE may be spaced apart from the source electrode SE with respect to the semiconductor pattern SM thereby exposing a portion of the semiconductor pattern SM. The semiconductor pattern SM may have a conductive channel between the source electrode SE and the drain electrode DE. The exposed portion of the semiconductor pattern SM may form the conductive channel.

The thin film transistor TFT may include the gate electrode GE, the source electrode SE, the drain electrode DE and the semiconductor pattern SM.

The data insulation layer 120 may be disposed on the gate insulation layer 110. The data insulation layer 120 may insulate the data pattern from other elements or layers of the display panel.

The gate line GL, the data line DL and the switching element may be disposed on the gate insulation layer 110. The switching element may include the gate electrode GE, the gate insulation layer 110, the semiconductor pattern SM, the source electrode SE and the drain electrode DE. The gate insulation layer 110 may be disposed on a whole surface of the substrate 100.

The data insulation layer 120 may be disposed on the gate line GL, the data line DL and the switching element. The data insulation layer 120 may be disposed on a whole surface of the substrate 100.

The color filter CF and the black matrix BM may be disposed on the data insulation layer 120.

The color filter CF may be disposed on the data insulation layer 120.

The color of light may be changed by the color filter CF and the light changed by the color filter CF may penetrate the image displaying layer 300. A plurality of color filters CF may include a red color filter, green color filter and a blue color filter, but the invention is not limited thereto. Each color filter CF may correspond to one of the pixel areas. Color filters CF, which are adjacent to each other, may have different colors from each other. In an exemplary embodiment of the invention, the color filters CF adjacent to each other may partially overlap each other at a border between pixel areas adjacent to each other. Alternatively, color filters CF may be spaced apart from each other at a border between pixel areas adjacent to each other.

The black matrix BM may overlap signal lines and may block light. The signal lines may be connected to the thin film transistors TFT. The signal lines may include, but are not limited to, a gate line GL, a data line DL, etc.

The black matrix BM may be disposed on a collective area where the gate line GL, the data line DL and the switching element are disposed. The black matrix BM may include chromium ("Cr") or chromium oxide ("CrOx").

The black matrix BM may be disposed on the color filter CF. The black matrix BM may be overlapped with a plurality of the gate lines GL extending in the first direction D1, to thereby block a light. The pixel area may include a display area in which an image is displayed, and a non-display area in which the image is not displayed. The black matrix BM may be disposed on the non-display area of the pixel area.

In accordance with an exemplary embodiment of the invention, the display panel has a structure such as a color filter on array ("COA") structure and a black matrix on array ("BOA") structure. In the COA structure, the color filter is disposed on a lower surface of the image displaying layer 300. In the BOA structure, the black matrix is disposed on a lower surface of the image displaying layer 300. Alternatively, the color filter or the black matrix may be disposed on an upper surface of the image displaying layer 300.

The first electrode EL1 may be disposed on the color filter CF. The first electrode EL1 may be electrically connected to the thin film transistor TFT. The first electrode EL1 may be disposed on a pixel area. A grayscale voltage may be applied to the first electrode EL1 through the thin film transistor TFT. In one exemplary embodiment, for example, the first electrode EL1 may include a transparent conductive material, such as indium tin oxide ("ITO"), indium zinc oxide ("IZO") and aluminum zinc oxide ("AZO"). In an exemplary embodiment, for example, the first electrode EL1 may have a slit pattern defined therein.

The passivation layer 130 may cover the first electrode EL1 and the black matrix BM. The passivation layer 130 may insulate the first electrode EL1 from other elements or layers of the display panel. The passivation layer 130 may be disposed on a whole surface of the substrate 100.

The supporter SP may be disposed on the passivation layer 130. The supporter SP may be disposed on and overlap the gate lines GL and the black matrix BM. The supporter SP may support the roof layer 200. In one exemplary embodiment, for example, the supporter SP may include or be formed by a photoresist material.

The display panel may include the alignment layer PIL to align the image displaying layer 300.

The alignment layer PIL may be disposed between the image displaying layer 300 and the passivation layer 130 and between the image displaying layer 300 and the second electrode EL2. That is, the alignment layer PIL may be disposed in a tunnel-shaped cavity TSC. The alignment layer PIL may be disposed on a lower surface of the protection layer 400 in the tunnel-shaped cavity TSC.

The alignment layer PIL pre-tilts liquid crystal molecules in the image displaying layer 300. The alignment layer PIL may include or be formed using an alignment liquid. In an exemplary embodiment of a method of manufacturing the display panel, the alignment liquid may be provided into the tunnel-shaped cavity TSC and then the alignment liquid may be partially removed at room temperature or by heating. The alignment liquid may be a combination of an alignment material, such as polyimide ("PI"), and a solvent.

The alignment liquid is a fluid, and therefore, the alignment liquid may be drawn into the tunnel-shaped cavity TSC due to capillary action. In one exemplary embodiment, for example, the alignment liquid may be provided into the tunnel-shaped cavity TSC through an opening exposing an inner area of the tunnel-shaped cavity TSC.

In an exemplary embodiment of a method of manufacturing the display panel, the alignment liquid may be provided into the tunnel-shaped cavity TSC by using an inkjet process having a micropipette or a vacuum injection apparatus. After providing the alignment liquid, the alignment liquid may be partially removed. The substrate 100 may be maintained at room temperature or may be heated.

In an alternative exemplary embodiment, the alignment layer PIL may be omitted in accordance with a type of the image displaying layer 300 and/or a structure of the first electrode EL1 and the second electrode EL2. In one exemplary embodiment, for example, when the first electrode EL1 has a micro slit structure defined therein, the liquid crystal molecules in the image displaying layer 300 may be aligned without the alignment layer PIL, and thus, the alignment layer PIL may be omitted. Alternatively, when a reactive mesogen layer for aligning the liquid crystal molecules is disposed in the display panel, the alignment layer PIL may be omitted.

The second electrode EL2 may be disposed on the alignment layer PIL. The second electrode EL2 may be insulated from the first electrode EL1. In one exemplary embodiment, for example, the first electrode EL1 may include a transparent conductive material, such as indium tin oxide ("ITO"), indium zinc oxide ("IZO") and aluminum zinc oxide ("AZO"). In an exemplary embodiment, for example, the first electrode EL1 may have a slit pattern defined therein.

The roof layer 200 may be disposed on the color filter CF and the second electrode EL2.

The roof layer 200 and the color filter CF may define the tunnel-shaped cavity TSC extending along the second direction D2 crossing the first direction D1. An opening OP defined in the roof layer 200 may expose an inner area of the tunnel-shaped cavity TSC, and the opening OP is adjacent to the gate lines GL. In an exemplary embodiment of a method of manufacturing the display panel, a fluid, such as an alignment liquid and a liquid crystal liquid, may be provided to the opening OP by using an inkjet process.

A cross-sectional thickness h1 of an area of the roof layer 200 adjacent to the gate lines GL, such as where the opening OP is defined, is smaller than a cross-sectional thickness h2 of another area of the roof layer 200 spaced apart from the gate lines GL. In an exemplary embodiment, for example, a cross section of the roof layer 200 along the second direction D2 may be a semi-spherical shape. Thus, when a liquid is provided on the roof layer 200 in a method of manufacturing the display panel, the liquid may move into the tunnel-shaped cavity TSC by an inertia force.

The roof layer 200 may include or be formed from a photoresist material. In an exemplary embodiment, for example, the photoresist material may be a positive-type or a negative-type.

The image displaying layer 300 may be disposed in the tunnel-shaped cavity TSC.

In one exemplary embodiment, for example, the image displaying layer 300 may be a liquid crystal layer. An alignment of the liquid crystal molecule in the LC layer may be controlled by an electric field applied between the first electrode EL1 and the second electrode EL2. Therefore, a light transmittance of the pixel may be controlled.

Alternatively, the image displaying layer 300 may be an electrophoretic layer. The electrophoretic layer may include an insulation medium and charged particles. The insulation medium may include a dispersion medium. The charged particles may include particles having electrophoretic properties. The charged particles are dispersed in the insulation medium. The charged particles may be moved in accordance with an electric field. Therefore, light that is emitted towards the electrophoretic layer may pass through the electrophoretic layer or may be blocked by the charged particles, thus displaying an image.

The protection layer 400 may be disposed on the roof layer 200. That is, the protection layer 400 may cover the roof layer 200. The protection layer 400 may surround the upper surface or a side surface of the roof layer 200, thereby encapsulating the tunnel-shaped cavity TSC.

The display panel may further include a first polarizer POL1 and a second polarizer POL2. The first polarizer POL1 may be disposed on a lower surface of the substrate 100. The second polarizer POL2 may be disposed on the protection layer 400.

The first polarizer POL1 may be disposed on a lower surface of the substrate 100. In one exemplary embodiment, for example, the first polarizer POL1 may be attached on a lower surface of the substrate 100. The first polarizer POL1 may polarize light provided from a backlight assembly (not illustrated) and incident thereto. The first polarizer POL1 may have a first polarized axis. The first polarizer POL1 may pass through light having the first polarized axis.

A second polarizer POL2 may be disposed on the protection layer 400. In one exemplary embodiment, for example, the second polarizer POL2 may be attached on an upper surface of the protection layer 400. Alternatively, when the protection layer 400 is omitted, the second polarizer POL2 may be attached on the color filter CF and the black matrix BM. The second polarizer POL2 may polarize light that penetrates the color filter CF. The second polarizer POL2 may have a second polarized axis. The second polarized axis may be substantially perpendicular to the first polarized axis. The second polarizer may pass through light having the second polarized axis.

FIGS. 4A to 12 are cross-sectional views illustrating an exemplary embodiment of a method of manufacturing a display panel, taken along line I-I' in FIG. 2, in accordance with the invention.

In an exemplary embodiment of the invention, a color filter layer is formed on a substrate. The substrate includes a plurality of thin-film transistors disposed thereon, and a plurality of gate lines disposed thereon and respectively connected to a thin film transistor. A sacrificial layer is formed on the color filter. A photoresist material is coated on the substrate to cover the sacrificial layer. A roof layer is formed by exposing the photoresist material to light. A height of the roof layer adjacent to the gate lines is smaller than a height of the roof layer spaced apart from the gate lines.

Referring to FIGS. 1 to 4A, a substrate 100 including a plurality of gate lines GL, a gate insulation layer 110 and a data insulation layer 120 may be provided. A supporter SP is formed on the substrate 100.

Figure 4A:
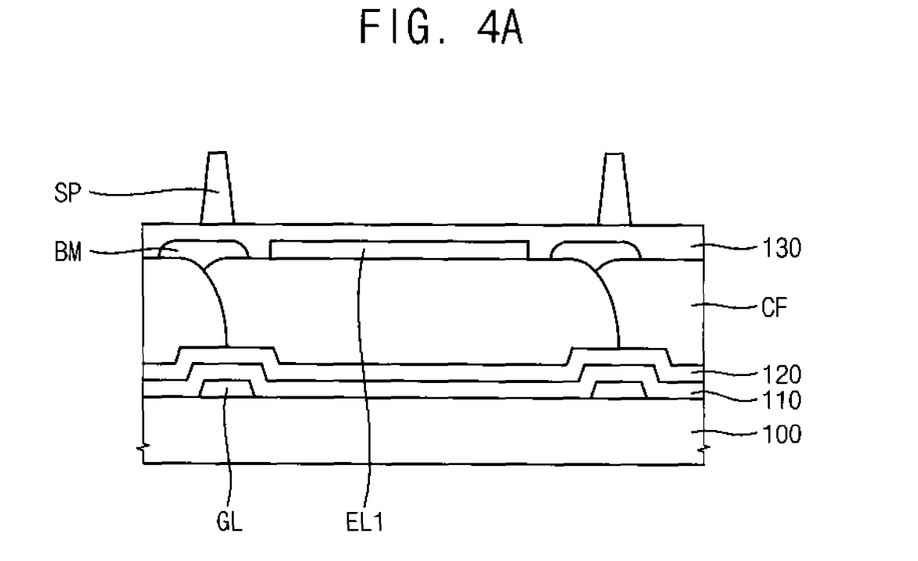

A gate pattern including a gate electrode GE and a gate line GL may be formed on the substrate 100. The gate insulation layer 110 may be formed on the substrate 100 including the gate pattern. A data pattern including a data line DL, a source electrode SE and a drain electrode DE may be formed on the gate insulation layer 110. The data insulation layer 120 may be formed on the gate insulation layer 110 including the data pattern.

The color filter CF may be formed on the data insulation layer 120. The color filter CF may include a red color filter, green color filter and a blue color filter. The color filter CF may include an organic macromolecular material. The color filter CF may be formed by a photolithography process using a photosensitive macromolecular material. Alternatively, the color filter CF may be formed by an inkjet process.

The first electrode EL1 may be disposed on the color filter CF. The first electrode EL1 may have a slit pattern. A first electrode conductive layer may be formed, and then the first electrode conductive layer may be patterned by a photolithography, thereby forming the first electrode EL1. For example, the first electrode EL1 may include a transparent conductive material, such as indium tin oxide ("ITO"), indium zinc oxide ("IZO") and aluminum zinc oxide ("AZO").

The black matrix BM may be formed on the color filter CF. The black matrix BM may be overlapped with the gate lines GL, the data lines DL and the switching element to block light. The black matrix BM may include chromium ("Cr") or chromium oxide ("CrOx").

The passivation layer 130 may cover the first electrode EL1 and the black matrix BM. The passivation layer 130 may be formed on a whole surface of the substrate 100. The passivation layer 130 may be formed by depositing an inorganic material including a silicon nitride (SiNx) or a silicon oxide (SiOx) or an organic material.

The supporter SP may be formed on the passivation layer 130. The supporter SP may be disposed on the gate lines GL and the black matrix BM. The supporter SP may support the roof layer 200. In an exemplary embodiment, for example, the supporter SP may be formed from a photoresist material. The photoresist material may be coated to form a photoresist layer, and then the photoresist layer may be patterned by a photolithography to form the supporter SP.

Referring to FIGS. 1 to 4B, a sacrificial layer 140 may be formed on the substrate 100, at locations where the supporter SP is formed.

Figure 4B:
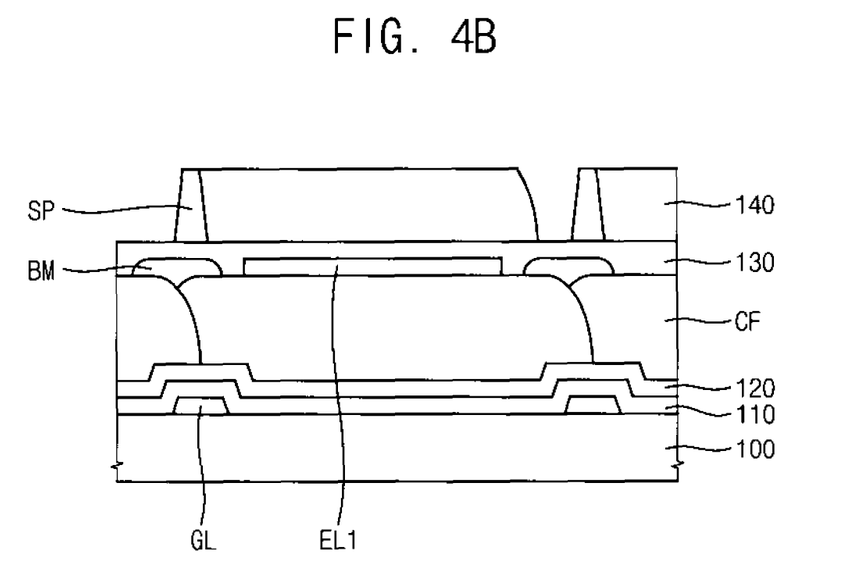

In accordance with an exemplary embodiment of the invention, a sacrificial layer 140 is formed on the passivation layer 130. The sacrificial layer 140 may include an organic macromolecule material. In an exemplary embodiment, for example, the organic macromolecule material may be, but is not limited to, benzocyclobutene ("BCB") and an acrylic resin. The sacrificial layer 140 may be formed by coating a photoresist material, which is not hardened by exposure. In an exemplary embodiment, for example, the photoresist material may include a positive photoresist.

The sacrificial layer 140 may be formed by deposition and ashing processes or by deposition and polishing processes. Alternatively, the sacrificial layer 140 may be formed by an inkjet process or a spin-coating process.

The sacrificial layer 140 may be partially removed to form the tunnel-shaped cavity TSC. Thus, the sacrificial layer 140 may be formed with a width and a height corresponding to a width and a height of the tunnel-shaped cavity TSC.

Referring to FIGS. 1 to 4C, the second electrode EL2 may be formed on the sacrificial layer 140.

Figure 4C:
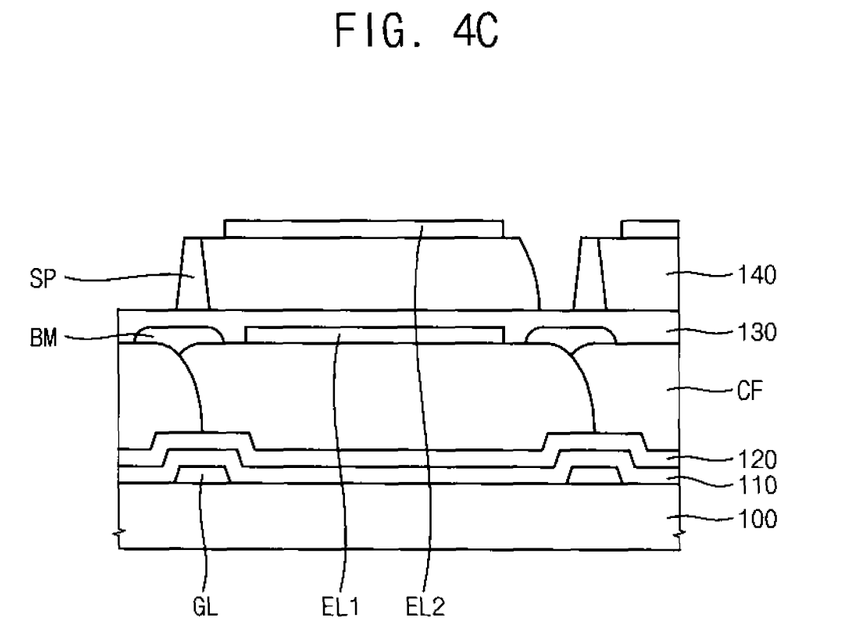

In accordance with an exemplary embodiment of the invention, the second electrode EL2 may be arranged corresponding to a pixel area. The second electrode EL2 may include a transparent conductive material such as indium tin oxide ("ITO") and indium zinc oxide ("IZO").

Referring to FIGS. 1 to 4D, a photoresist material may be coated on the substrate 100, where the sacrificial layer 140 and the second electrode EL2 are formed, so that a photoresist coating layer 201 may be formed.

Figure 4D:
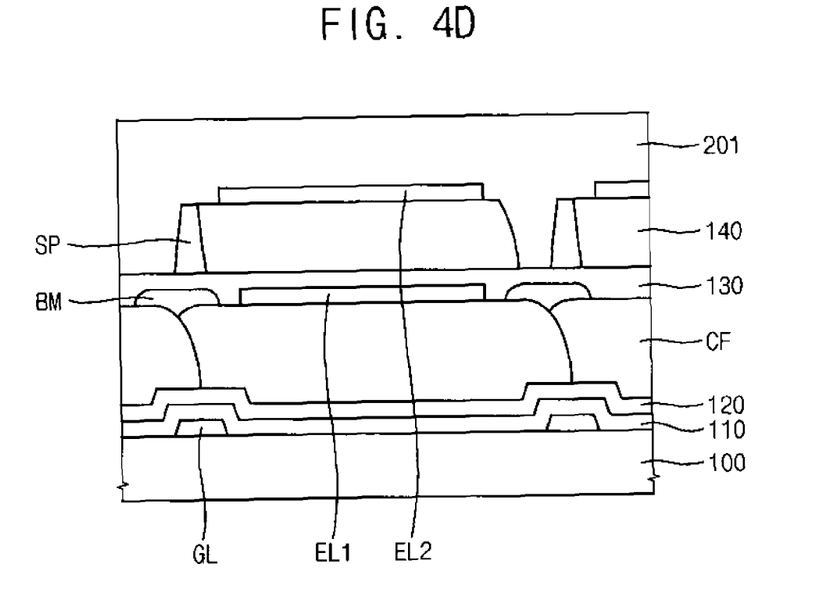

The roof layer 200 may be formed using the photoresist material. In an exemplary embodiment, for example, the photoresist material may be a positive type or a negative type. The photoresist coating layer 201 may be formed on a whole surface of the substrate 100.

Referring to FIGS. 1 to 6, the substrate 100 may be exposed to light, and then developed, thereby forming the roof layer 200.

Figure 6:
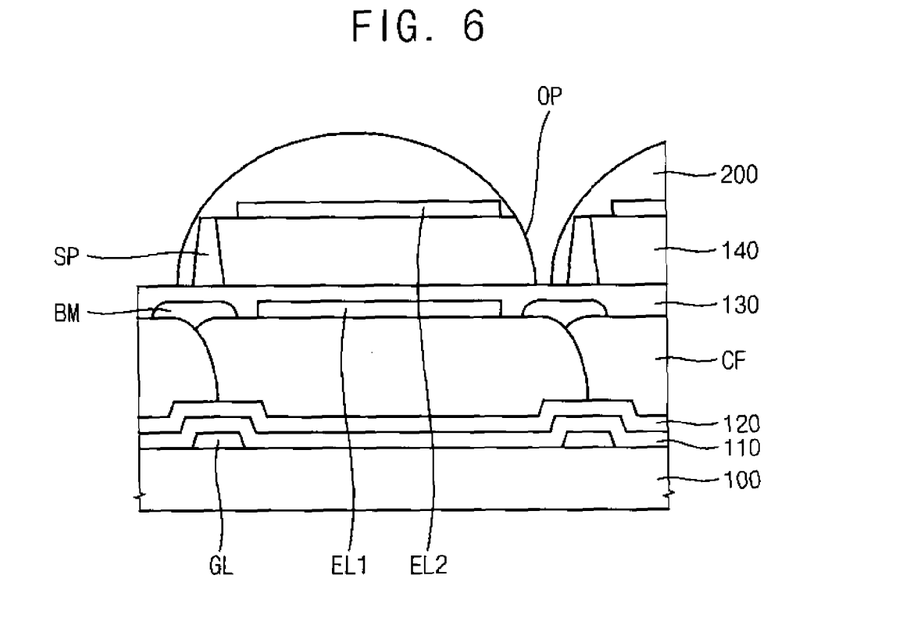

The photoresist coating layer 201 may be patterned using a slit mask including a slit area SA and a blocking area BA.

The blocking area BA includes a blocking pattern, and a slit area SA includes a slit pattern. The slit mask may be aligned on the photoresist coating layer 201, and then, light may be irradiated onto the slit mask.

The blocking pattern and the slit pattern may include chromium ("Cr") or chromium oxide ("CrOx"). Accordingly, while light to the blocking area BA may be blocked by the light blocking pattern, light to the slit area SA may pass through the slit pattern to expose the photoresist coating layer 201.

Then, the photoresist coating layer 201 exposed by the slit mask may be developed by a developer to form the roof layer 200.

The patterns may be spaced apart by a predetermined interval. Alternatively, the slit pattern may have various types of slit pattern, so that the roof layer 200 may have various shapes. That is, the slit pattern may be formed to have a narrow slit pattern to transmit light. Alternatively, the slit pattern may be formed to have a wide slit pattern to thereby transmit plenty of light.

A shape and a cross-sectional thickness of the photoresist coating layer 201 may be controlled by the blocking area BA and the slit area SA of the slit mask.

Figure 5A:
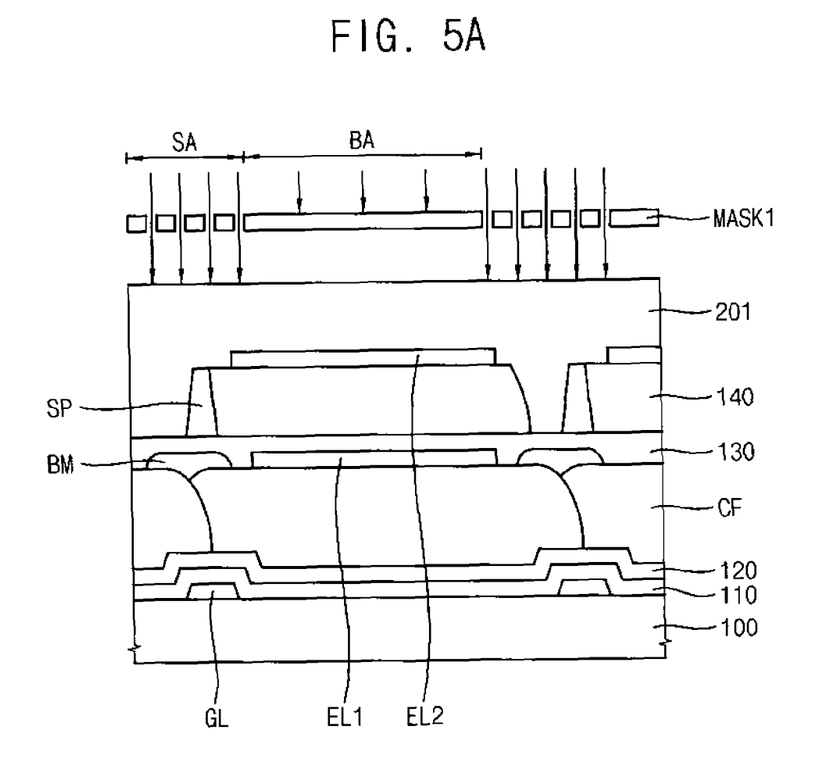

Referring to FIG. 5A, in accordance with an exemplary embodiment of the invention, when the photoresist material is a positive type, the substrate 100 may be exposed using a first slit mask MASK1. The slit area SA of the first slit mask MASK1 may be disposed on and overlapping the gate lines GL. Thus, an area of the photoresist coating layer 201 adjacent to the gate lines GL may be exposed to light (as indicated by the downward arrows). The area of the photoresist coating layer 201 exposed to the light may be developed by a developer, so that the photoresist coating layer 201 may be partially removed.

Figure 5B:
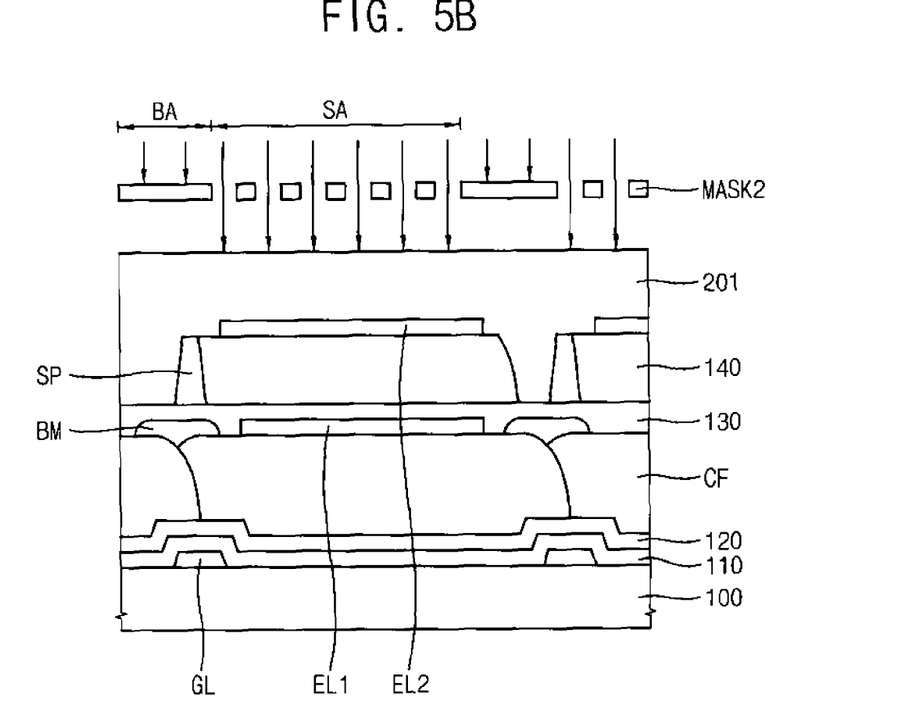

Referring to FIG. 5B, in accordance with an exemplary embodiment of the invention, when the photoresist material is a negative type, the substrate 100 may be exposed using a second slit mask MASK2. The blocking area BA of the second slit mask MASK2 may be disposed on and overlapping the gate lines GL. Thus, an area of the photoresist coating layer 201 adjacent to the gate lines GL may be blocked to light. An area of the photoresist coating layer 201 exposed to the light may be hardened and developed by a developer, so that the photoresist coating layer 201 may be partially removed.

The intensity of light used for a light exposure may be in a range from about 300 millijoules (mJ) to about 3 joules (J). The wavelength of the light may be about 365 nanometers (nm).

Therefore, the roof layer 200 including an opening OP defined therein on a side surface thereof may be formed using the slit masks MASK1 and/or MASK2. While the figures show a solid line indicating at an edge of the roof layer 200 at the opening OP, it will be understood that a side surface or edge of the roof layer 200 is absent at the portion thereof which defines the opening OP and the solid line indicates a side surface of the sacrificial layer 140.

Figure 7:
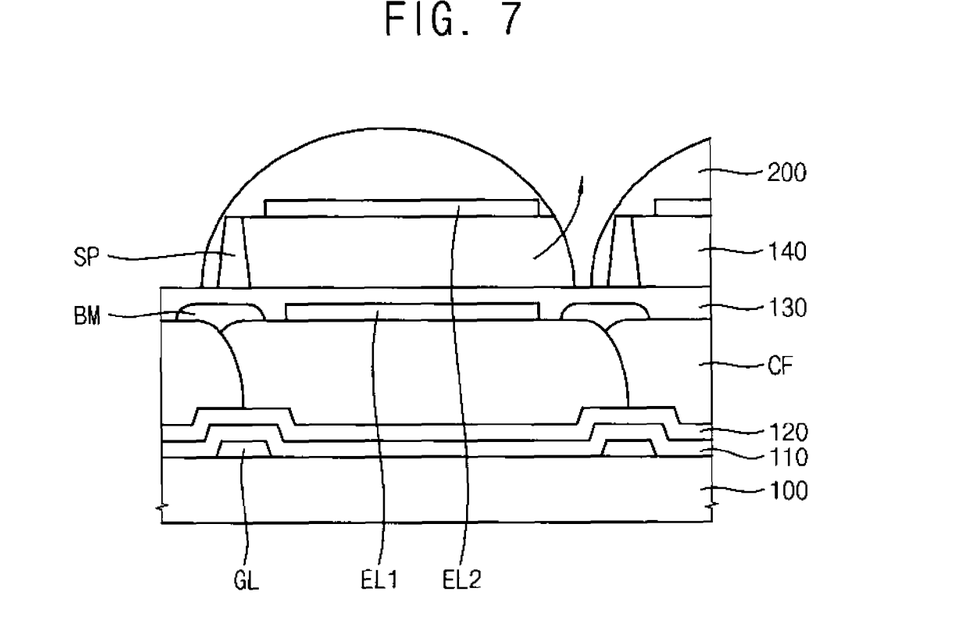

Referring to FIGS. 1 to 8, the sacrificial layer 140 may be partially removed by a plasma process to form the tunnel-shaped cavity TSC (refer to FIG. 7).

In an exemplary embodiment, for example, the sacrificial layer 140 may be progressively etched from a side surface of the sacrificial layer 140 to an inner space of the tunnel-shaped cavity TSC by an anisotropic plasma etching. Thus, an upper surface of the passivation layer 130 corresponding to the inner space of the tunnel-shaped cavity TSC, a lower surface of the second electrode EL2 and the roof layer 200, and a side surface of the supporter SP may be exposed (refer to FIG. 8).

Figure 8:
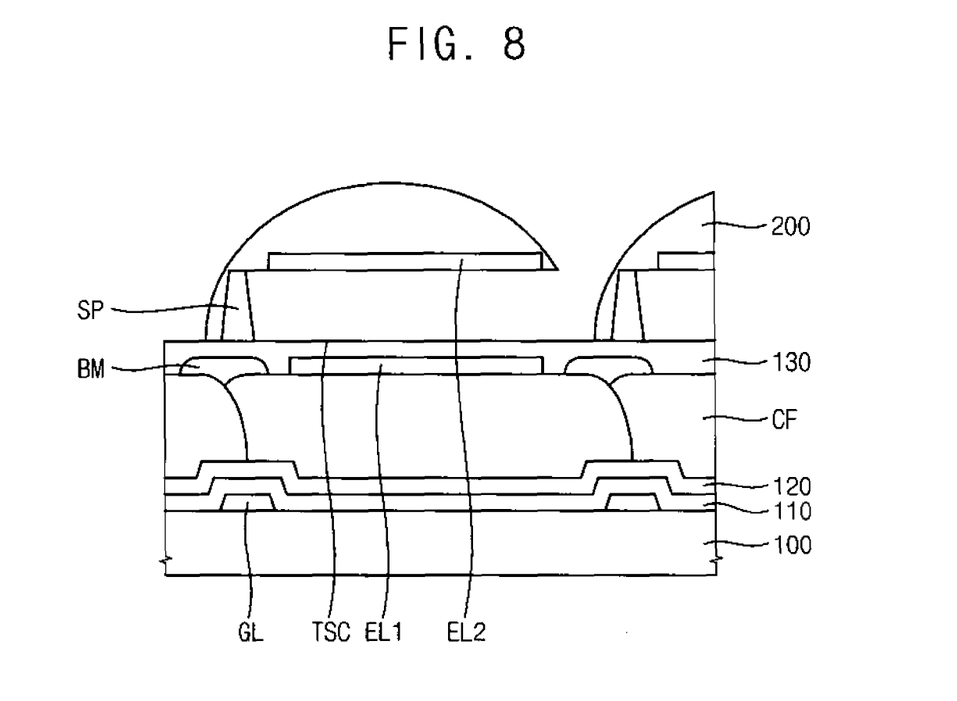
Figure 9:
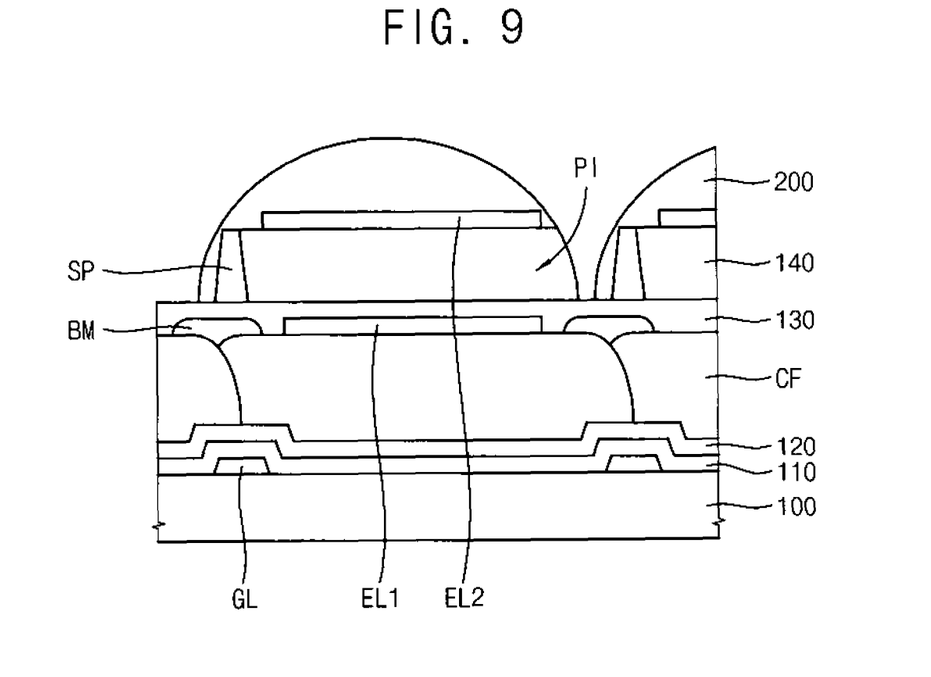

The plasma process may anisotropically remove a sacrificial layer 140. In an exemplary embodiment, for example, the plasma process may use microwave $O_2$ plasma. A condition of the microwave $O_2$ plasma, such as a stage temperature, a chamber pressure, a gas or the like, may be controlled, so that the microwave $O_2$ plasma may etch only the sacrificial layer 140.

In an exemplary embodiment, for example, in the condition of the microwave $O_2$ plasma for etching the sacrificial layer 140, a stage temperature of a plasma etching chamber is within a range of about 100 degrees Celsius (° C.) to about 300° C., a flow rate of $O_2$ is within a range of about 5,000 standard cubic centimeter per minute (sccm) to about 10,000 sccm, a flow rate of $N_2H_2$ is within a range of about 100 sccm to about 1,000 sccm, a pressure of the chamber is about 2 Torr, an applied power is within a range of about 100 watts (W) to about 4,000 W.

Thus, when the sacrificial layer 140 is removed, the tunnel-shaped cavity TSC may be formed at a position, where the sacrificial layer 140 was previously disposed.

Referring to FIGS. 1 to 10, an alignment layer PIL may be formed in the tunnel-shaped cavity TSC that is obtained by removing the sacrificial layer 140.

Figure 10:
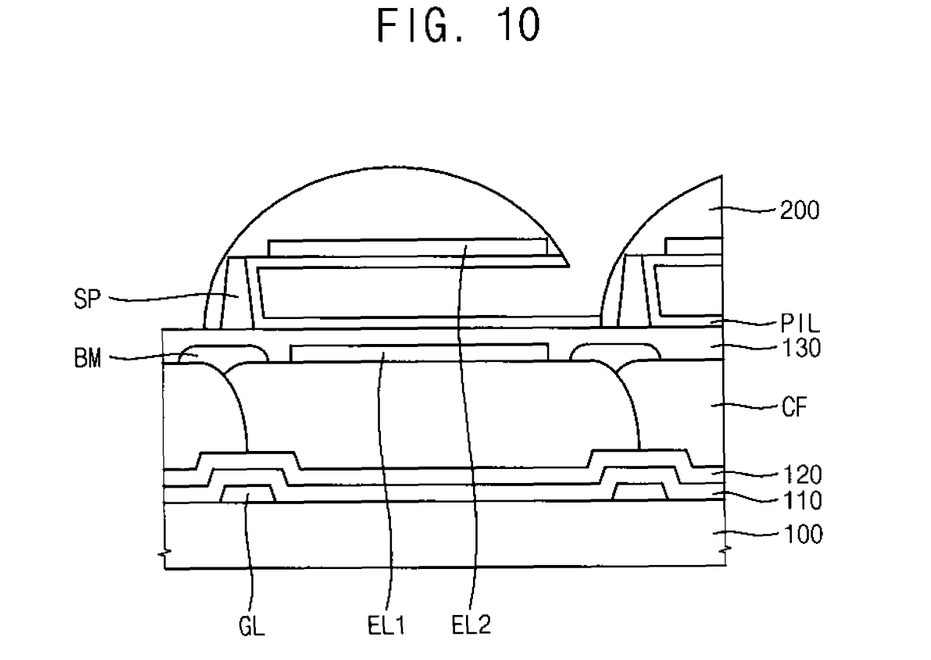
Figure 11:
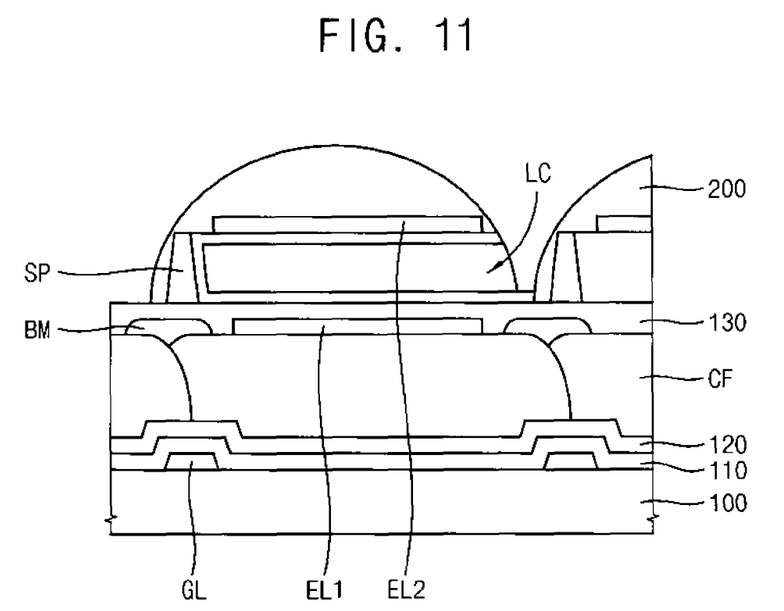

Referring to FIG. 10, the alignment layer PIL may be formed by an alignment liquid. Although FIG. 9 indicates PI into the tunnel-shaped cavity TSC, the alignment liquid may be obtained by a combination of an alignment material such as the polyimide ("PI") and a solvent. The alignment liquid may flow into the tunnel-shaped cavity TSC by capillary action. In one exemplary embodiment, for example, the alignment liquid may be provided into the tunnel-shaped cavity TSC through the opening OP defined by the roof layer 200.

The alignment liquid may be provided into the tunnel-shaped cavity TSC by using an inkjet having a micropipette. The solvent may be removed from the alignment liquid by leaving the substrate 100 at room temperature or by heating the substrate 100.

In an alternative exemplary embodiment, the alignment layer PIL may be omitted in accordance with the type of the image displaying layer 300 and/or the structure of the first electrode EL1 and the second electrode EL2. In one exemplary embodiment, for example, when the first electrode EL1 has a particular shape, and thus, the liquid crystal molecules of the image displaying layer 300 may be aligned without the alignment layer PIL, the alignment layer PIL may be omitted.

Referring to FIGS. 1 to 12, the image displaying layer 300 may be formed in the tunnel-shaped cavity TSC including the alignment layer PIL, but the invention is not limited thereto. A protection layer 400 may be formed on the roof layer 200. The protection layer 400 may surround the roof layer 200 and encapsulate the tunnel-shaped cavity TSC.

Figure 12:
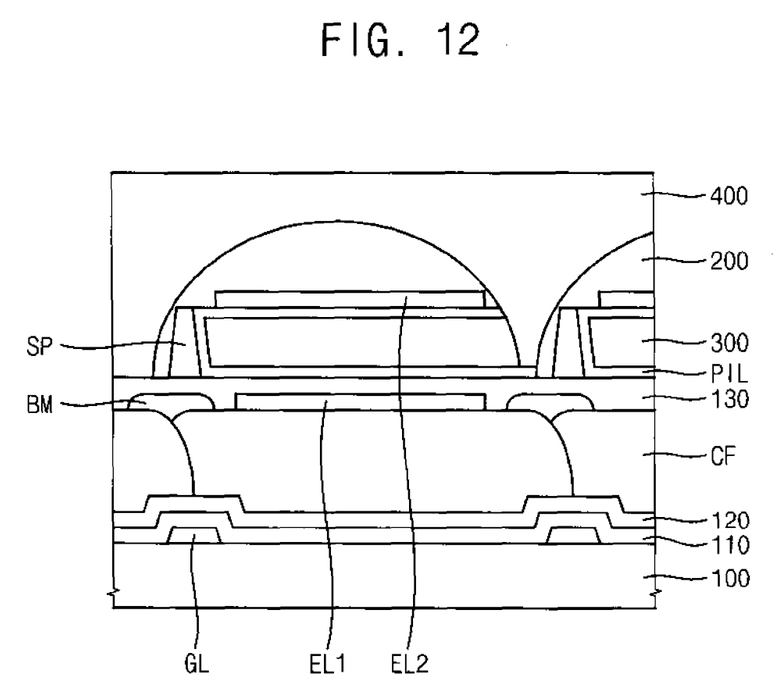

The image displaying layer 300 may be a liquid crystal layer including a liquid crystal ("LC"). The liquid crystal is provided as a fluid. The liquid crystal may flow into the tunnel-shaped cavity TSC by capillary action. In one exemplary embodiment, for example, the liquid crystal may be provided into the tunnel-shaped cavity TSC through the opening OP. Alternatively, the image displaying layer 300 may be an electrophoretic layer. The electrophoretic layer may include an insulation medium and charged particles.

The protection layer 400 may be disposed on the roof layer 200, so that the protection layer 400 may encapsulate the tunnel-shaped cavity TSC. That is, the protection layer 400 may block the opening OP and seal the tunnel-shaped cavity TSC including the image displaying layer 300 and the alignment layer PIL therein.

In accordance with one or more exemplary embodiment of the invention, the embedded micro-cavity ("EM") display panel may apply to a display apparatus or an organic electroluminescent apparatus.

Although exemplary embodiments of the invention have been described, it is understood that the invention should not be limited to these exemplary embodiments and various changes and modifications can be made by one of those ordinary skilled in the art within the spirit and scope of the invention as hereinafter claimed.

What is claimed is:
1. A display panel comprising:
a substrate comprising a thin film transistor thereon;
a gate line extending along a first direction on the substrate and connected to the thin film transistor;
a color filter on the substrate; and
a roof layer on the color filter and configured to define a tunnel-shaped cavity between the roof layer and the color filter, the tunnel-shaped cavity extending along a second direction crossing the first direction, wherein a cross-sectional thickness of an area of the roof layer adjacent to the gate line is smaller than a cross-sectional thickness of a different area of the roof layer spaced apart from the gate line.

2. The display panel of claim 1, wherein a cross section of the roof layer along the second direction is a semi-spherical shape.

3. The display panel of claim 1, further comprising:
a first electrode on an upper surface of the color filter; and
a second electrode on a lower surface of the roof layer.

4. The display panel of claim 3, further comprising:
a passivation layer covering the first electrode, and insulating the first electrode and the second electrode from each other.

5. The display panel of claim 3, wherein the roof layer covers the second electrode.

6. The display panel of claim 3, further comprising:
an image display layer in the tunnel-shaped cavity, and configured to display an image by an electric field applied thereto and formed between the first electrode and the second electrode.

7. The display panel of claim 1, further comprising:
a black matrix on the gate line and configured to block light.

8. The display panel of claim 7, further comprising:
a supporter on the black matrix and configured to support the roof layer.

9. The display panel of claim 1, further comprising:
a protection layer on the roof layer and encapsulating the tunnel-shaped cavity.

10. A method of manufacturing a display panel, comprising:
forming a color filter on a substrate comprising a thin film transistor thereon, and a gate line thereon and connected to the thin film transistor;
forming a sacrificial layer on the color filter;
coating a photoresist material on the substrate to cover the sacrificial layer; and
forming a roof layer by exposing the photoresist material to light, wherein a cross-sectional thickness of an area of the roof layer adjacent to the gate line is smaller than a cross-sectional thickness of a different area of the roof layer spaced apart from the gate line.

11. The method of claim 10, wherein the forming the roof layer comprises:
providing a slit mask on the substrate including the photoresist material, the slit mask comprising a slit area through which the light passes and a blocking area which blocks the light;
exposing the photoresist material on the substrate to the light; and
developing the exposed photoresist material on substrate.

12. The method of claim 11, wherein the photoresist material is a positive type.

13. The method of claim 12, wherein the slit area overlaps the gate line.

14. The method of claim 11, wherein the photoresist material is a negative type.

15. The method of claim 14, wherein the blocking area overlaps the gate line.

16. The method of claim 11, wherein the forming the roof layer further comprises defining an opening at a side surface of the roof layer.

17. The method of claim 10, further comprising:
after the forming the color filter, forming a first electrode on the color filter;
forming a black matrix on the gate line;
forming a passivation layer which covers the first electrode and the black matrix; and
forming a supporter on the black matrix, which supports the roof layer.

18. The method of claim 17, further comprising:
after the forming the sacrificial layer, forming a second electrode on the sacrificial layer.

19. The method of claim 10, further comprising:
removing the sacrificial layer by a developer to define a tunnel-shaped cavity from which the sacrificial layer is removed;
forming an alignment layer on surfaces defining the tunnel-shaped cavity; and
forming an image display layer in the tunnel-shaped cavity.

20. The method of claim 19, further comprising:
forming a protection layer surrounding the roof layer and sealing the alignment layer and the image display layer in the tunnel-shaped cavity.

* * * * *